United States Patent
Tatemura et al.

(10) Patent No.: US 10,241,245 B2
(45) Date of Patent: Mar. 26, 2019

(54) OPTICAL FILTER AND METHOD FOR MANUFACTURING OPTICAL FILTER

(71) Applicant: AGC Inc., Tokyo (JP)

(72) Inventors: Mitsuyuki Tatemura, Shizuoka (JP); Akinori Sakurai, Shizuoka (JP); Tadanari Naoe, Shizuoka (JP)

(73) Assignee: AGC Inc., Tokyo (JP)

( * ) Notice: Subject to any disclaimer, the term of this patent is extended or adjusted under 35 U.S.C. 154(b) by 464 days.

(21) Appl. No.: 14/951,687

(22) Filed: Nov. 25, 2015

(65) Prior Publication Data

US 2016/0077257 A1 Mar. 17, 2016

Related U.S. Application Data

(63) Continuation of application No. PCT/JP2014/063777, filed on May 26, 2014.

(30) Foreign Application Priority Data

May 31, 2013 (JP) .................... 2013-115027

(51) Int. Cl.
*G02B 5/20* (2006.01)
*C23C 14/54* (2006.01)
(Continued)

(52) U.S. Cl.
CPC .............. *G02B 5/208* (2013.01); *C23C 14/24* (2013.01); *C23C 14/54* (2013.01); *G02B 1/10* (2013.01); *G02B 5/226* (2013.01)

(58) Field of Classification Search
None
See application file for complete search history.

(56) References Cited

U.S. PATENT DOCUMENTS

| | | | |
|---|---|---|---|
| 2009/0128936 A1 | 5/2009 | Shibuya | |
| 2011/0085233 A1 | 4/2011 | Furusato | |
| 2012/0300170 A1* | 11/2012 | Fournand | G02B 1/115 351/159.01 |

FOREIGN PATENT DOCUMENTS

| CN | 101435888 A | 5/2009 |
|---|---|---|
| CN | 102043173 A | 5/2011 |

(Continued)

OTHER PUBLICATIONS

International Preliminary Report on Patentability and Written Opinion dated Dec. 15, 2015 in PCT/JP2014/063777 (submitting English language translation only).

(Continued)

*Primary Examiner* — Derek S Chapel
(74) *Attorney, Agent, or Firm* — Oblon, McClelland, Maier & Neustadt, L.L.P.

(57) ABSTRACT

There are provided an optical filter excellent in weather resistance and a method for manufacturing an optical filter. The optical filter of the present invention includes a transparent substrate, and an optical multilayer film provided on a surface of the transparent substrate. In the optical multilayer film, a low-refractive index film containing silicon oxide ($SiO_2$) and a high-refractive index film higher in refractive index than the low-refractive index film are alternately stacked. A density of a portion of the low-refractive index film close to an interface between the low-refractive index film and the high-refractive index film is lower than a density of a portion of the low-refractive index film other than the portion close to the interface.

20 Claims, 5 Drawing Sheets

(51) Int. Cl.
     *C23C 14/24*     (2006.01)
     *G02B 1/10*     (2015.01)
     *G02B 5/22*     (2006.01)

(56) References Cited

FOREIGN PATENT DOCUMENTS

| JP | 2-213803 A | | 8/1990 | |
|----|------------|---|--------|---|
| JP | 10-332931 A | | 12/1998 | |
| JP | 2002-258038 A | | 9/2002 | |
| JP | 2009-139925 A | | 6/2009 | |
| JP | 2011-100111 A | | 5/2011 | |
| JP | 2011132077 A | * | 7/2011 | |
| JP | 2012-118536 A | | 6/2012 | |
| KR | 20090050979 A | * | 5/2009 | ............. G02B 5/223 |

OTHER PUBLICATIONS

International Search Report dated Jun. 24, 2014 in PCT/JP2014/063777 filed on May 26, 2014.

* cited by examiner

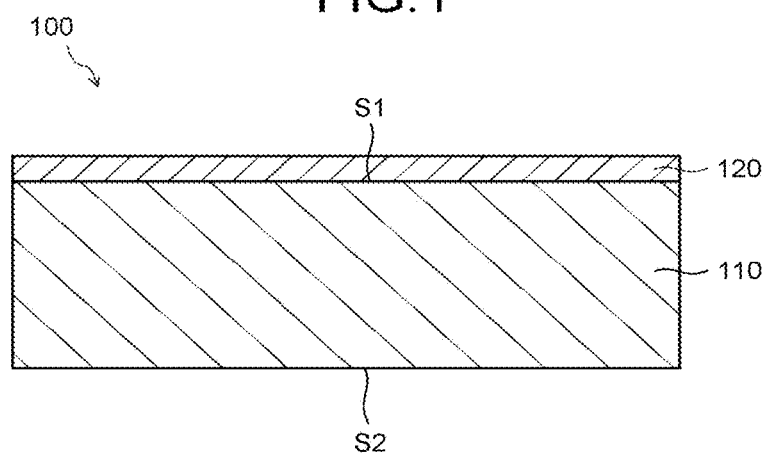
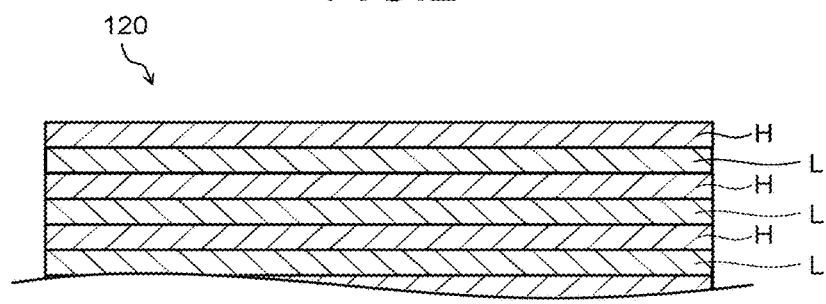

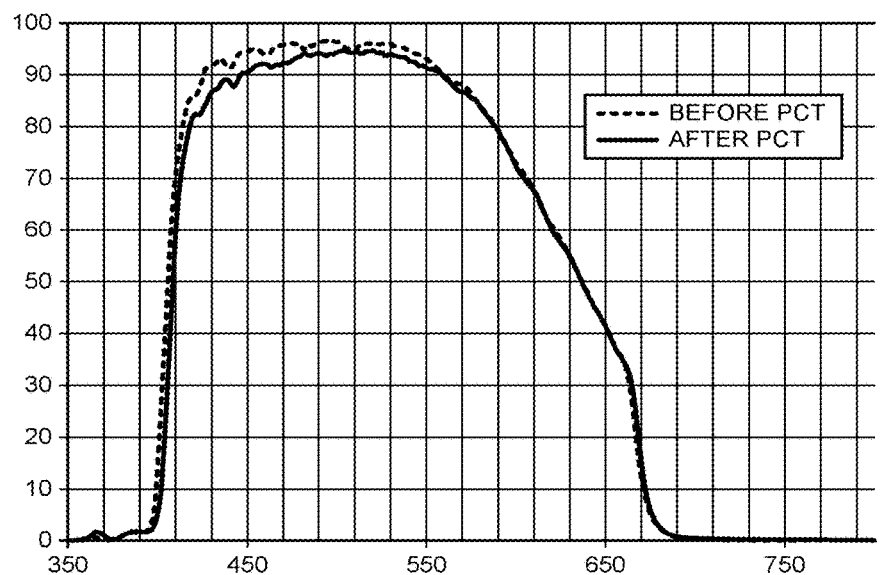
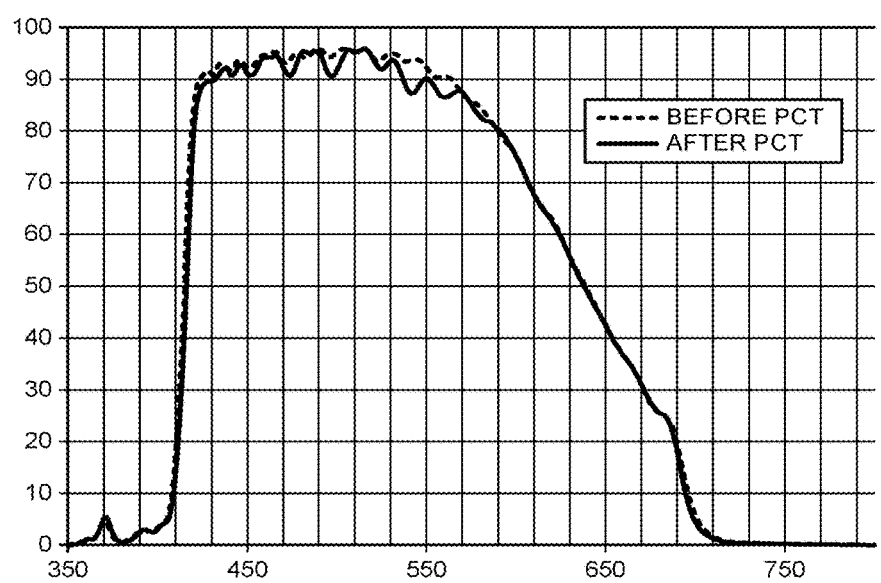

OPTICAL FILTER AND METHOD FOR MANUFACTURING OPTICAL FILTER

CROSS-REFERENCE TO RELATED APPLICATIONS

This application is a continuation of prior International Application No. PCT/JP2014/063777 filed on May 26, 2014 which is based upon and claims the benefit of priority from Japanese Patent Application No. 2013-115027 filed on May 31, 2013; the entire contents of all of which are incorporated herein by reference.

FIELD

An embodiment of the present invention relates to an optical filter and a method for manufacturing an optical filter, and in particular to an optical filter including a transparent substrate and an optical multilayer film formed on the transparent substrate.

BACKGROUND

In imaging apparatuses such as a digital camera, a digital video and the like, solid-state imaging devices such as a Charge Coupled Device (CCD) image sensor, a Complementary Metal Oxide Semiconductor (CMOS) image sensor and the like are installed. However, spectral characteristics of the solid-state imaging devices have high sensitivities with respect to an infrared ray as compared to human visibility characteristics. Hence, spectral correction is performed by installing a near-infrared cut filter in the imaging apparatuses.

The near-infrared cut filter is, for example, a near-infrared absorption type color glass filter such as fluorophosphoric acid-based glass containing $Cu^{2+}$ ions as a coloring component. However, the light in a near-infrared region and an ultraviolet region cannot be sufficiently cut only by the color glass filter. Therefore, use of an optical multilayer film in combination is proposed for sufficiently cutting the near-infrared ray.

SUMMARY

The near-infrared cut filter is required to be further improved in weather resistance (for example, a property of hardly causing alteration such as deformation, discoloration, or deterioration).

An object of the present invention is to provide an optical filter excellent in weather resistance and a method for manufacturing the optical filter.

An optical filter of the present invention includes: a transparent substrate; and an optical multilayer film provided on a surface of the transparent substrate. In the optical multilayer film, a low-refractive index film containing silicon oxide ($SiO_2$) and a high-refractive index film higher in refractive index than the low-refractive index film are alternately stacked. A density of a portion of the low-refractive index film close to an interface between the low-refractive index film and the high-refractive index film is lower than a density of a portion of the low-refractive index film other than the portion close to the interface.

According to the present invention, the weather resistance of the optical multilayer film can be improved.

BRIEF DESCRIPTION OF THE DRAWINGS

FIG. 1 is a cross-sectional view of a near-infrared cut filter according to an embodiment.

FIG. 2 is a cross-sectional view of an optical multilayer film formed on a transparent substrate.

FIG. 6 is a chart illustrating spectral characteristics of a near-infrared cut filter according to Example 1.

FIG. 7 is a chart illustrating spectral characteristics of a near-infrared cut filter according to Example 2.

DETAILED DESCRIPTION (Embodiment)

Figure 3:
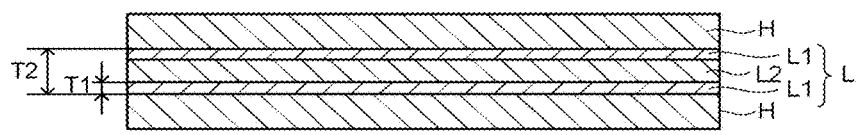
FIG. 3 is an enlarged cross-sectional view of the low-refractive index film.

FIG. 1 is a cross-sectional view of a near-infrared cut filter 100 (hereinafter, IRCF 100) according to an embodiment. As illustrated in FIG. 1, the IRCF 100 has a transparent substrate 110, and an optical multilayer film 120 formed on a principal surface S1 of the transparent substrate 110.

(Transparent Substrate 110)

The material of the transparent substrate 110 is not particularly limited as long as the material transmits at least light in a visible wavelength region. Examples of the material of the transparent substrate 110 include glass, crystalline quartz, other crystals (lithium niobate, sapphire and so on), polyester resins (polyethylene terephthalate (PET), polybutylene terephthalate (PBT) and so on), polyolefin resins (polyethylene, polypropylene, ethylene-vinyl acetate copolymer and so on), a norbornene resin, acrylic resins (polyacrylate, polymethyl methacrylate and so on), a urethane resin, a vinyl chloride resin, a fluorocarbon resin, a polycarbonate resin, a polyvinyl butyral resin, a polyvinyl alcohol resin and so on.

The transparent substrate 110 is preferably the one absorbing, in particular, light in a near-infrared-wavelength region. When the transparent substrate 110 absorbs the light in the near-infrared-wavelength region, an imaging apparatus can image an image of an image quality close to human visibility characteristics. Note that the transparent substrate 110 absorbing the light in the near-infrared-wavelength region is, for example, absorbing-type glass made by adding $Cu^{2+}$ (ion) to fluorophosphate-based glass or phosphate-based glass. A resin material made by adding an absorbent absorbing a near-infrared ray thereinto may be used as the above-described transparent substrate 110. The absorbent is, for example, dye, pigment, or a metal complex-based compound. Concretely, the absorbent is a phthalocyanine-based compound, a naphthalocyanine-based compound, or a dithiol metal complex-based compound.

Note that the fluorophosphate-based glass contains a fluorine component in glass and thereby has high weather resistance. Therefore, by forming the optical multilayer film 120 on the transparent substrate 110 of the fluorophosphate-based glass, an optical filter (IRCF 100) with high weather resistance can be obtained.

(Optical Multilayer Film 120)

The optical multilayer film 120 is formed, as illustrated in FIG. 1, on the principal surface S1 of the transparent substrate 110. The optical multilayer film 120 is, for example, a filter cutting the near-infrared ray (IR). The optical multilayer film 120 has a transmission band and a stop band. The transmission band of the optical multilayer film 120 is a band where an average transmittance for light in a wavelength range of 400 to 700 nm is 85% or more. In contrast, the stop band of the optical multilayer film 120 is a band where the average transmittance for light in a wavelength range of 750 to 1100 nm is 10% or less, located on the near-infrared side of the transmission band, and its band width is 100 to 280 nm.

FIG. 2 is a cross-sectional view of the optical multilayer film 120. As illustrated in FIG. 2, the optical multilayer film 120 includes a high-refractive index film H and a low-refractive index film L.

In the optical multilayer film 120, the high-refractive index film H has a refractive index, when the wavelength of light is 500 nm, of 2.0 or more. On the other hand, the low-refractive index film L has a refractive index, when the wavelength of light is 500 nm, of less than 1.6.

The high-refractive index film H and the low-refractive index film L are alternately stacked n times as expressed by the following Expression (1).

$$(HL)\hat{\ }n \text{ (n is a natural number of 1 or more)} \quad (1)$$

The high-refractive index film H of the optical multilayer film 120 is formed of a material having a refractive index, when the wavelength of light is 500 nm, of 2.0 or more. The high-refractive index film H is preferably formed of, for example, titanium oxide ($TiO_2$), niobium oxide ($Nb_2O_5$), tantalum oxide ($Ta_2O_5$), or composite oxide thereof. Further, the high-refractive index film H may contain additives besides the above-described material as long as the above-described refractive index becomes 2.0 or more.

The low-refractive index film L of the optical multilayer film 120 contains silicon oxide ($SiO_2$). The low-refractive index film L may contain other additives in addition to silicon oxide as long as the refractive index, when the wavelength of light is 500 nm, becomes less than 1.6. Note that silicon oxide contained in the low-refractive index film L may be silicon oxide that is partially deficient in oxygen and stoichiometrically incomplete. This is because there is a possibility that all of silicon oxide cannot be formed as $SiO_2$ when forming the low-refractive index film L.

In this embodiment, the low-refractive index film L is constituted so that the density of a portion thereof close to the interface with the high-refractive index film H is lower than the density of a portion other than the portion close to the interface.

FIG. 3 is an enlarged cross-sectional view of the low-refractive index film L. As illustrated in FIG. 3, the low-refractive index film L has a structure including a first low-refractive index film L1 and a second low-refractive index film L2 which are stacked.

In the low-refractive index film L, at a portion on the side close to the interface between the low-refractive index film L and the high-refractive index film H located on the upper side thereof, the first low-refractive index film L1 is formed. Additionally, at a portion on the side close to the interface between the low-refractive index film L and the high-refractive index film H located on the lower side thereof, the first low-refractive index film L1 is formed. In other words, the first low-refractive index films L1 are formed both at the portion located on the upper side and the portion located on the lower side in the low-refractive index film L respectively. Each of the first low-refractive index films L1 is formed to intervene between the high-refractive index film H and the second low-refractive index film L2 in the optical multilayer film 120.

At a middle portion in the film thickness direction in the low-refractive index film L, the second low-refractive index film L2 is located. The second low-refractive index film L2 is sandwiched between the first low-refractive index film L1 formed on the upper side portion and the first low-refractive index film L1 formed on the lower side portion. The second low-refractive index film L2 is formed such that the first low-refractive index film L1 intervenes between the second low-refractive index film L2 and the high-refractive index film H in the optical multilayer film 120. Here, the second low-refractive index film L2 is formed to be higher in density than the first low-refractive index film L1.

Note that the first low-refractive index film L 1 preferably has a physical film thickness T1 of 3 nm or more and equal to or lower than half a physical film thickness T2 of the low-refractive index film L. In other words, the first low-refractive index film L1 preferably satisfies the following Expression (2). When the physical film thickness T1 of the first low-refractive index film L1 is less than 3 nm, there is a possibility that the first low-refractive index film L1 cannot be surely formed on the entire surface of the high-refractive index film H. On the other hand, when the physical film thickness T1 of the first low-refractive index film L1 exceeds half the physical film thickness T2 of the low-refractive index film L, the proportion of the first low-refractive index film L1 in the low-refractive index film L becomes too large. Therefore, there is a possibility that the heat resistance of the optical multilayer film 120 does not sufficiently improve. Note that T2 in the following Expression (2) is an average value of the physical film thickness of all of the low-refractive index films L constituting the optical multilayer film 120.

$$3 \text{ nm} \leq T1 \leq T2/2 \quad (2)$$

T1: the physical film thickness of the first low-refractive index film L1

T2: the physical film thickness of the low-refractive index film L

The high-refractive index film H and the low-refractive index film L can be formed by the vacuum deposition method. In the optical multilayer film 120, the transmission band is a wavelength band used for receiving light in a solid-state imaging device such as a CCD, a CMOS or the like, and therefore its film thickness accuracy is important. The vacuum deposition method is excellent in film thickness control when forming a thin film and therefore can form the high-refractive index film H and the low-refractive index film L with highly accurate film thicknesses.

Further, the first low-refractive index film L1 and the second low-refractive index film L2 can be formed with their densities adjusted through control of the degree of vacuum in a film forming chamber. Concretely, by increasing the degree of vacuum in the film forming chamber, a low-refractive index film with a low density can be formed. By decreasing the degree of vacuum in the film forming chamber, a low-refractive index film with a high density can be formed. The degree of vacuum in the film forming chamber can be controlled by adjusting the flow rate of gas (for example, an oxygen ($O_2$) gas) to be introduced into the film forming chamber.

Note that the low-refractive index film L has a structure in which the first low-refractive index film L1 and the second low-refractive index film L2 are stacked as described above in FIG. 3, but is not limited to this. The low-refractive index film L may be formed such that the density gradually increases with increasing distance from the interface between the low-refractive index film L and the high-refractive index film H in a direction (film thickness direction) vertical to the principal surfaces S1, S2 of the transparent substrate 110. In this case, by performing film formation with the degree of vacuum in the film forming chamber gradually changed, the low-refractive index film L can be formed as described above.

Figure 4:
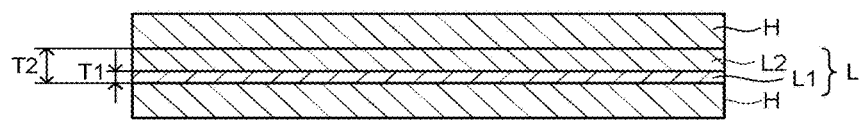
FIG. 4 is an enlarged cross-sectional view of the low-refractive index film.

Further, the low-refractive index film L is provided with the first low-refractive index films L1 at the interface side located on the lower side and at the interface side located on the upper side respectively in FIG. 3, but is not limited to this. As illustrated in FIG. 4, the first low-refractive index film L1 may be formed on the interface side located on the lower side but not on the interface side located on the upper side in the low-refractive index film L. In other words, the first low-refractive index film L1 only needs to be formed at least on one of the portion located on the upper side and the portion located on the lower side in the low-refractive index film L.

As described above, in this embodiment, the IRCF 100 includes the transparent substrate 110 and the optical multilayer film 120 provided on the principal surface S1 of the transparent substrate 110. The optical multilayer film 120 includes the low-refractive index film L containing silicon oxide ($SiO_2$) and the high-refractive index film H higher in refractive index than the low-refractive index film L, which are stacked. Further, the low-refractive index film L is constituted so that the density of a portion thereof close to the interface with the high-refractive index film H is lower than the density of a portion other than the portion close to the interface.

Therefore, the IRCF 100 in this embodiment has a small change in spectral characteristics between before and after execution of a PCT (pressure cooker test) and thus can prevent occurrence of haze. Further, the IRCF 100 in this embodiment is high in heat resistance and is therefore difficult to cause film cracks in the optical multilayer film 120 even after it is exposed to a high-temperature state. The reason why can be considered as follows from the result of study.

In the case of forming the optical multilayer film by the vacuum deposition method or the sputtering method using ion assist, oxygen deficiency may occur at a portion of the high-refractive index film. This phenomenon is remarkable in the case of forming a silicon oxide ($SiO_2$) film on the front surface of the high-refractive index film H formed of titanium oxide ($TiO_2$) or niobium oxide ($Nd_2O_5$). Therefore, the above-described phenomenon is considered to occur because silicon oxide high in activity deprives the high-refractive index film H, which is formed of titanium oxide or niobium oxide, of oxygen. Note that the above-described phenomenon is considered to occur to no small extent also in the optical multilayer film formed by a heating deposition method without using ion assist.

In the case where the degree of vacuum for film formation in a heating deposition apparatus (film forming chamber) is high when forming the silicon oxide film being the low-refractive index film L, the mean free path of the deposition material becomes long, so that the low-refractive index film L is in contact with the high-refractive index film H formed of titanium oxide or the like in a state where the energy activity is high. Therefore, a portion of the silicon oxide is considered to deprive the high-refractive index film H of oxygen to cause oxygen deficiency in the high-refractive index film H Further, in the case of performing film formation in a high vacuum state, it is considered that the oxygen deficiency occurs in silicon oxide itself to promote the above-described phenomenon.

Normally, most of the high-refractive index film H in which oxygen deficiency has been caused is low in water resistance and is likely to become brittle due to tests such as the PCT (pressure cooker test). Therefore, it is presumed that haze occurs in the optical multilayer film 120 after execution of the PCT (pressure cooker test).

Therefore, to suppress occurrence of haze in the optical multilayer film 120 due to execution of the PCT (pressure cooker test), the silicon oxide film to be formed on the interface side with the high-refractive index film H in the low-refractive index film L is formed at a low degree of vacuum for film formation to suppress occurrence of the oxygen deficiency in the high-refractive index film H in this embodiment. Specifically, at the time when forming, in the low-refractive index film L, the silicon oxide film at the interface with the high-refractive index film H, a silicon oxide film low in energy activity is formed by introducing the oxygen gas into the heating deposition apparatus to thereby decrease the degree of vacuum for film formation.

For forming the silicon oxide film low in energy activity, it is possible to perform decreasing the temperature of the transparent substrate, decreasing the heating temperature of a deposition agent or the like besides the adjustment of the degree of vacuum for film formation. However, the adjustment of the temperature of the transparent substrate 110 is not suitable for forming the second low-refractive index film L2 higher in density than the first low-refractive index film L1. Further, decreasing the heating temperature of the deposition agent causes a decrease in film-forming rate. Accordingly, it is preferable to perform adjustment of the degree of vacuum for film formation by introducing the gas into the heating deposition apparatus.

Further, in the method of adjusting the degree of vacuum for film formation by introducing the gas into the heating deposition apparatus, other gas such as an argon gas may be used besides the oxygen gas. However, to compensate for the above-described oxygen deficiency, it is preferable to use the oxygen gas at least partially.

From the above, in the IRCF 100 in this embodiment, a portion of the low-refractive index film L close to the interface with the high-refractive index film H is formed at a low degree of vacuum for film formation to form into the first low-refractive index film L1 low in density. Therefore, it is possible to suppress occurrence of the oxygen deficiency in the high-refractive index film H in this embodiment. As a result, the IRCF 100 in this embodiment has a small change in spectral characteristics between before and after the PCT (pressure cooker test) and thus can prevent occurrence of haze.

A tensile stress often acts on almost all of films formed by the heating deposition, and the tensile stress similarly acts also on the high-refractive index film H in this embodiment. In contrast, a compressive stress often acts on the silicon oxide film, and the compressive stress becomes larger as the silicon oxide film is denser (higher in density). In this embodiment, the compressive stress acts on the IRCF 100 in a state where the high-refractive index film H and the low-refractive index film L are stacked. In particular, the proportion of the second low-refractive index film L2 is larger in this embodiment, so that a larger compressive stress acts.

When the transparent substrate 110 on which the optical multilayer film 120 is formed is heated, the transparent substrate 110 becomes larger due to thermal expansion, whereby the optical multilayer film 120 is drawn. Therefore, film cracks sometimes occur in the optical multilayer film 120. However, when the compressive stress acting on the optical multilayer film 120 is large, the degree that the transparent substrate 110 becomes larger due to the thermal expansion is reduced. Therefore, the occurrence of film cracks in the optical multilayer film 120 at high temperatures is reduced in this embodiment. Accordingly, the existence of the second low-refractive index film L2 has an effect to greatly improve the film crack resistance at high temperatures in this embodiment.

The fact that the densities of the first low-refractive index film L1 and the second low-refractive index film L2 are different from each other can be confirmed by the following method.

First, the IRCF 100 in which the optical multilayer film 120 is formed is cut so that the cross section of the optical multilayer film 120 can be observed. For example, the IRCF 100 is cut in a direction vertical to the principal surface S1 of the transparent substrate 110. Then, the RCF 100 is immersed in a hydrogen fluoride (HF) solution (concentration: 0.25%) for 15 seconds in a manner that the cross section of the optical multilayer film 120 is immersed in the hydrogen fluoride solution. Then, the cross section of a portion of the optical multilayer film 120 immersed in the hydrogen fluoride solution is observed under a SEM (scanning electron microscope).

At a part low in density in the low-refractive index film L which is likely to be eroded with the hydrogen fluoride solution, many voids occur. In the IRCF 100 in this embodiment, occurrence of voids selectively at a portion of the low-refractive index film L on the interface side with the high-refractive index film H is observed by the above-described observation method. In other words, in this embodiment, more voids occur in the first low-refractive index film L1 located on the side close to the interface with the high-refractive index film H in the low-refractive index film L than in the second low-refractive index film L2 located at the center in the low-refractive index film L.

Note that a portion of the void becomes a deeper color than a portion that is not the void in the SEM observation image, and therefore they can be distinguished from each other. Therefore, the frequencies of occurrence of voids can be compared based on the areas of the voids in the SEM observation image. As the comparison method, for example, a method of performing image processing of binarizing the SEM observation image and then calculating and comparing the areas of a bright portion and a dark portion in a specific range in the processed observation image, can be exemplified. Other publicly-known methods can be used.

In the case where the whole low-refractive index film L is formed with the same density, voids are not selectively occur unlike the above but voids occur at the same degree in the whole low-refractive index film L.

As described above, in this embodiment, the weather resistance (for example, a property of hardly causing alteration such as deformation, discoloration, or deterioration) of the optical filter such as the near-infrared cut filter can be further improved.

Because the optical filter is sometimes exposed to a high temperature exceeding 100° C. during a part of the manufacturing process of the optical filter, the optical multilayer film 120 needs to have high heat resistance. In this embodiment, it is possible to suppress occurrence of film cracks in the optical multilayer film 120 at high temperatures.

It is also possible to suppress occurrence of white haze in the optical multilayer film 120 in a state of high humidity (The PCT (pressure cooker test) is an accelerated test for evaluating the weather resistance under a high-humidity environment).

As described above, in this embodiment, it is possible to form the optical filter having extremely high weather resistance by the vacuum deposition method without using ion assist or the like. Therefore, it is unnecessary to replace the existing vacuum deposition apparatus with an expensive vacuum deposition apparatus with ion assist, so that the cost effectiveness is extremely high.

Further, ion assist or the like may cause an extremely high compressive stress in the optical multilayer film 120 and thereby cause deformation such as large warpage of the optical filter. However, in this embodiment, it becomes possible to suppress also the deformation of the optical filter.

(Modification Example of the Embodiment)

As described above, the embodiment of the present invention has been described in detail based on the above concrete example. However, the embodiment of the present invention is not limited to the above concrete example, but every modification and change may be made without departing from the scope of the present invention.

The optical multilayer film 120 in the case of being formed on the principal surface S1 of the transparent substrate 110 is described in the above embodiment, but is not limited to this. The optical multilayer film 120 may be formed, similarly to the above, for example, on both of the principal surface S1 of the transparent substrate 110 and on a principal surface S2 located on the opposite side to the principal surface S1. In other words, the optical multilayer film 120 may be formed, similarly to the above, at least one of the principal surface S1 of the transparent substrate 110 and the principal surface S2 located on the opposite side to the principal surface S1.

Besides the above, the optical multilayer film may be a UV cut filter that cuts an ultraviolet ray (UV), a UV/IR cut filter that cuts an infrared ray and an ultraviolet ray, an anti-reflection film or the like. Further, optical multilayer films with different configurations may be provided stacked on one of the principal surfaces of the transparent substrate. Furthermore, an adherence enhancing layer (adhesion strength enhancing layer) may be provided between the optical multilayer film and the transparent substrate. Further, a film that suppresses a ripple may be provided between the optical multilayer film and the transparent substrate. Moreover, an antistatic layer may be further provided on a layer (air side) located on an uppermost surface side of the optical multilayer film.

(Imaging Apparatus 200)

The above-described IRCF 100 is used, for example, for a visibility correction filter in imaging apparatuses such as a digital still camera, a digital video camera, a monitoring camera, an on-vehicle camera, and a web camera, an automatic exposure meter and the like. In the above imaging apparatus, the IRCF 100 is disposed, for example, between an imaging lens and a solid-state imaging device. In the automatic exposure meter, the IRCF 100 is disposed, for example, in front of a light-receiving element.

In the imaging apparatus, the IRCF 100 may be disposed at a position away from the front surface of the solid-state imaging device. Further, the IRCF 100 may be directly bonded to the solid-state imaging device or a package of the solid-state imaging device. Further, a cover that protects the solid-state imaging device may be provided as the IRCF 100. Further, the IRCF 100 may be directly bonded to a low-pass filter using crystals such as crystalline quartz, lithium niobate or the like so as to suppress moire and false color.

Figure 5:
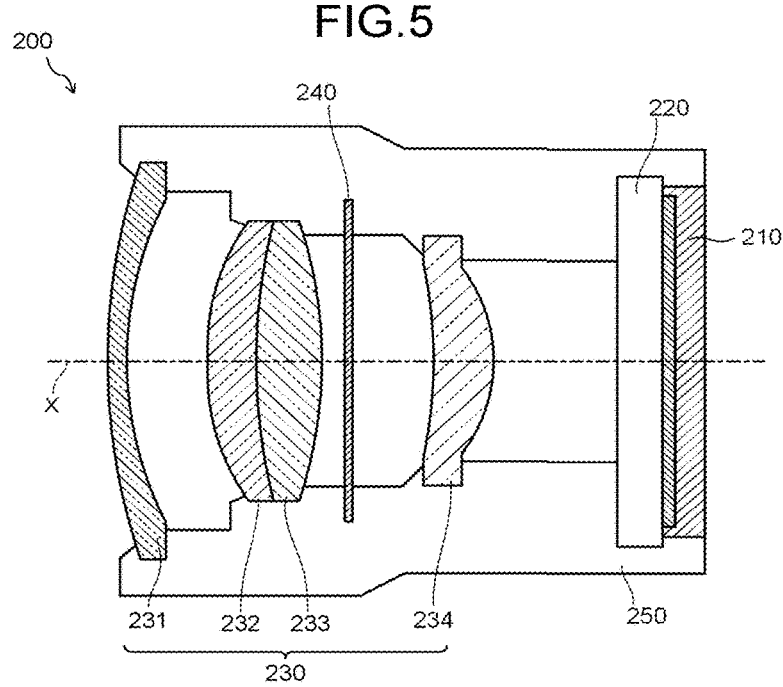
FIG. 5 is a partial cross-sectional view of an imaging apparatus.

Next, a concrete example will be illustrated. FIG. 5 is a partial configuration view of an imaging apparatus 200.

The imaging apparatus 200 is, for example, a digital still camera, a digital video camera, a monitoring camera, an on-vehicle camera, or a web camera. The imaging apparatus 200 includes, as illustrated in FIG. 5, a solid-state imaging device 210, a cover glass 220, a lens group 230, a diaphragm 240, and a casing 250. The solid-state imaging device 210, the cover glass 220, the lens group 230, and the diaphragm 240 are arranged along an optical axis x.

The solid-state imaging device 210 is, for example, a Charge Coupled Device (CCD) image sensor or a Complementary Metal Oxide Semiconductor (CMOS) image sensor. The solid-state imaging device 210 converts inputted light to an electric signal and outputs the electric signal to an image signal processing circuit (not-illustrated).

The cover glass 220 is disposed on an imaging plane side (lens group 230 side) of the solid-state imaging device 210 to protect the solid-state imaging device 210 from the external environment.

The lens group 230 is disposed on the imaging plane side of the solid-state imaging device 210. The lens group 230 includes first to fourth lenses 231 to 234, and the first to fourth lenses 231 to 234 guide light incident thereon to the imaging plane of the solid-state imaging device 210.

The diaphragm 240 is disposed between the third lens 233 and the fourth lens 234 of the lens group 230. The diaphragm 240 is configured to be able to adjust the amount of light passing therethrough.

The casing 250 houses the solid-state imaging device 210, the cover glass 220, the lens group 230 and the diaphragm 240.

In the imaging apparatus 200, light incident thereon from a subject side sequentially passes through the first lens 231, the second lens 232, the third lens 233, the diaphragm 240, the fourth lens 234, and the cover glass 220, and is made incident on the solid-state imaging device 210. The light incident on the solid-state imaging device 210 is converted by the solid-state imaging device 210 to an electric signal, and the electric signal is outputted as an image signal.

The IRCF 100 is used, for example, as the cover glass 220, the lens group 230 (the first lens 231, the second lens 232, the third lens 233, or the fourth lens 234). In other words, the cover glass or the lend group of the conventional imaging apparatus is used as the transparent substrate 110, and the optical multilayer film 120 is provided on the front surface of the transparent substrate 110. Alternatively, the optical multilayer film 120 may be disposed as an independent optical filter in any space from the first lend 231 to the cover glass 220.

The IRCF 100 is applied to the cover glass 220 or the lens group 230 in the imaging apparatus 200, whereby an optical filter excellent in weather resistance can be obtained.

EXAMPLES

Examples will be concretely described.

Here, near-infrared cut filters (IRCFs) according to Examples 1, 2 and Comparative Examples 1, 2 were produced as illustrated below. In the IRCF in each Example, the high-refractive index film was formed using titanium oxide ($TiO_2$) and the low-refractive index film was formed using silicon oxide ($SiO_2$). Further, for the transparent substrate, a glass substrate having a thickness of 0.3 mm (near-infrared cut glass, NF-50, manufactured by AGC TECHNO GLASS CO., LTD.) was used.

After producing the IRCF in each Example, the PCT (pressure cooker test, test conditions (temperature: 121° C., humidity: 100% RH, time: 36 hours, pressure: 2.1 atmospheres) was carried out to examine "spectral characteristics," "film crack," and "haze."

(Spectral Characteristics)

For the IRCF in each Example, the PCT was carried out under the above conditions. Then, the change in spectral characteristics between before and after the PCT was carried out was evaluated.

(Film Crack)

The IRCF in each Example was left at rest for two minutes in a state at a temperature of 250° C. Thereafter, for the IRCF in each Example, the presence or absence of cracks in the optical multilayer film 120 was evaluated visually or using a microscope.

(Haze)

For the IRCF in each Example, whether haze occurred in the optical multilayer film between before and after the PCT was carried out under the above conditions was evaluated. Here, the evaluation was carried out using a haze meter (manufactured by NIPPON DENSHOKU INDUSTRIES CO., LED., product name: NDH5000).

Example 1

In Example 1, the IRCF was produced by providing the optical multilayer film in which the high-refractive index film H and the low-refractive index film L were alternately stacked on the front surface (principal surface S1) of the transparent substrate and providing an anti-reflection film (AR) composed of six layers on the rear surface (principal surface S2) of the transparent substrate.

Film formation conditions of Example 1 will be indicated below.

(Degree of Vacuum in Film Formation)

High-refractive index film H ($TiO_2$): $1.3 \times 10^{-2}$ Pa

First low-refractive index film L1 ($SiO_2$): $6.5 \times 10^{-3}$ Pa

Second low-refractive index film L2 ($SiO_2$): $2.0 \times 10^{-3}$ Pa (Transparent Substrate Temperature in Film Formation)

The temperature of the transparent substrate was set to 190° C.

(Film-Forming Rate)

High-refractive index film H ($TiO_2$): 4 Å/S (angstrom/sec)

Low-refractive index film L ($SiO_2$): 6 Å/S (angstrom/sec)

Table 1 lists film conditions (film configuration, film material, physical film thickness) of the optical multilayer film formed on the front surface (principal surface S1) of the transparent substrate in Example 1. Note that a mixture α in Table 1 indicates a mixture of alumina ($Al_2O_3$) and zirconium oxide ($ZrO_2$) (this also applies to Table 2 and Table 3).

TABLE 1

| | Example 1 | | |
|---|---|---|---|
| | Layer number | Material | Physical film thickness (nm) |
| X1 | 1 | Mixture α | 10.00 |
| Y1 | 2 | $TiO_2$ | 12.87 |
| Y2 | 3 | $SiO_2$ | 38.04 |
| H | 4 | $TiO_2$ | 122.23 |

TABLE 1-continued

Example 1

| Layer number | | Material | Physical film thickness (nm) |
|---|---|---|---|
| L1 | 5 | SiO$_2$ | 10.00 |
| L2 | 6 | SiO$_2$ | 180.28 |
| H | 7 | TiO$_2$ | 118.36 |
| L1 | 8 | SiO$_2$ | 10.00 |
| L2 | 9 | SiO$_2$ | 186.25 |
| H | 10 | TiO$_2$ | 119.35 |
| L1 | 11 | SiO$_2$ | 10.00 |
| L2 | 12 | SiO$_2$ | 186.68 |
| H | 13 | TiO$_2$ | 119.88 |
| L1 | 14 | SiO$_2$ | 10.00 |
| L2 | 15 | SiO$_2$ | 184.83 |
| H | 16 | TiO$_2$ | 118.75 |
| L1 | 17 | SiO$_2$ | 10.00 |
| L2 | 18 | SiO$_2$ | 179.29 |
| H | 19 | TiO$_2$ | 105.71 |
| L1 | 20 | SiO$_2$ | 10.00 |
| L2 | 21 | SiO$_2$ | 154.80 |
| H | 22 | TiO$_2$ | 103.57 |
| L1 | 23 | SiO$_2$ | 10.00 |
| L2 | 24 | SiO$_2$ | 174.68 |
| H | 25 | TiO$_2$ | 109.59 |
| L1 | 26 | SiO$_2$ | 10.00 |
| L2 | 27 | SiO$_2$ | 155.58 |
| H | 28 | TiO$_2$ | 91.56 |
| L1 | 29 | SiO$_2$ | 10.00 |
| L2 | 30 | SiO$_2$ | 140.59 |
| H | 31 | TiO$_2$ | 85.04 |
| L1 | 32 | SiO$_2$ | 10.00 |
| L2 | 33 | SiO$_2$ | 135.04 |
| H | 34 | TiO$_2$ | 84.46 |
| L1 | 35 | SiO$_2$ | 10.00 |
| L2 | 36 | SiO$_2$ | 133.78 |
| H | 37 | TiO$_2$ | 82.69 |
| L1 | 38 | SiO$_2$ | 10.00 |
| L2 | 39 | SiO$_2$ | 132.73 |
| H | 40 | TiO$_2$ | 83.39 |
| L1 | 41 | SiO$_2$ | 10.00 |
| L2 | 42 | SiO$_2$ | 132.02 |
| H | 43 | TiO$_2$ | 83.55 |
| L1 | 44 | SiO$_2$ | 10.00 |
| L2 | 45 | SiO$_2$ | 132.99 |
| H | 46 | TiO$_2$ | 84.71 |
| L1 | 47 | SiO$_2$ | 10.00 |
| L2 | 48 | SiO$_2$ | 132.31 |
| H | 49 | TiO$_2$ | 84.82 |
| L1 | 50 | SiO$_2$ | 10.00 |
| L2 | 51 | SiO$_2$ | 135.76 |
| H | 52 | TiO$_2$ | 87.09 |
| L1 | 53 | SiO$_2$ | 10.00 |
| L2 | 54 | SiO$_2$ | 140.80 |
| H | 55 | TiO$_2$ | 86.62 |
| L1 | 56 | SiO$_2$ | 10.00 |
| L2 | 57 | SiO$_2$ | 66.06 |

As listed in Table 1, in Example 1, a film X1 (adhesion strength enhancing layer) made of the mixture α was formed on the front surface of the transparent substrate by the heating deposition method in order to improve the adhesion to the transparent substrate. Then, a TiO$_2$ film Y1 and a SiO$_2$ film Y2 were formed in sequence by the heating deposition method on the front surface of the transparent substrate via the film X1 made of the mixture α in order to suppress the ripple. Thereafter, using the combination of the high-refractive index film H, the first low-refractive index film L1, and the second low-refractive index film L2 as a base unit, and film formation was repeatedly performed by the base unit, whereby the optical multilayer film was formed on the front surface of the transparent substrate. In other words, in Example 1, the first low-refractive index film L1 is formed at an upper side portion close to the interface located on the upper side and the first low-refractive index film L1 is not formed at a lower side portion close to the interface located on the lower side in the low-refractive index film L.

FIG. 6 is a chart illustrating the spectral characteristics of the IRCF according to Example 1. In FIG. 6, the vertical axis represents the transmittance and the horizontal axis represents the wavelength. Note that, in FIG. 6, a chain line indicates the spectral characteristics before the PCT and a solid line indicates the spectral characteristics after the PCT. As illustrated in FIG. 6, in Example 1, the spectral characteristics have little or no change between before and after execution of the PCT. Further, in Example 1, no film crack occurred and occurrence of haze was not confirmed.

Example 2

In Example 2, the IRCF was produced by providing the optical multilayer film in which the high-refractive index film H and the low-refractive index film L were alternately stacked on the front surface (principal surface S1) of the transparent substrate and providing an anti-reflection film (AR) composed of six layers on the rear surface (principal surface S2) of the transparent substrate.

Film formation conditions of Example 2 will be indicated below.

(Degree of Vacuum in Film Formation)
High-refractive index film H (TiO$_2$): $1.3 \times 10^{-2}$ Pa
First low-refractive index film L1 (SiO$_2$): $6.5 \times 10^{-3}$ Pa
Second low-refractive index film L2 (SiO$_2$): $2.0 \times 10^{-3}$ Pa (Transparent Substrate Temperature in Film Formation)
The temperature of the transparent substrate was set to 190° C.

(Film-forming Rate)
High-refractive index film H (TiO$_2$): 4 Å/S (angstrom/sec)
Low-refractive index film L (SiO$_2$): 6 Å/S (angstrom/sec)

Table 2 lists film conditions (film configuration, film material, physical film thickness) of the optical multilayer film formed on the front surface (principal surface S1) of the transparent substrate in Example 2.

TABLE 2

Example 2

| Layer number | | Material | Physical film thickness (nm) |
|---|---|---|---|
| X1 | 1 | Mixture α | 10.00 |
| Y1 | 2 | TiO$_2$ | 12.87 |
| Y2 | 3 | SiO$_2$ | 10.00 |
| Y3 | 4 | SiO$_2$ | 28.04 |
| H | 5 | TiO$_2$ | 122.23 |
| L1 | 6 | SiO$_2$ | 10.00 |
| L2 | 7 | SiO$_2$ | 170.28 |
| L1 | 8 | SiO$_2$ | 10.00 |
| H | 9 | TiO$_2$ | 118.36 |
| L1 | 10 | SiO$_2$ | 10.00 |
| L2 | 11 | SiO$_2$ | 176.25 |
| L1 | 12 | SiO$_2$ | 10.00 |
| H | 13 | TiO$_2$ | 119.35 |
| L1 | 14 | SiO$_2$ | 10.00 |
| L2 | 15 | SiO$_2$ | 176.68 |
| L1 | 16 | SiO$_2$ | 10.00 |
| H | 17 | TiO$_2$ | 119.88 |
| L1 | 18 | SiO$_2$ | 10.00 |
| L2 | 19 | SiO$_2$ | 174.83 |
| L1 | 20 | SiO$_2$ | 10.00 |
| H | 21 | TiO$_2$ | 118.75 |
| L1 | 22 | SiO$_2$ | 10.00 |
| L2 | 23 | SiO$_2$ | 169.29 |
| L1 | 24 | SiO$_2$ | 10.00 |
| H | 25 | TiO$_2$ | 105.71 |

TABLE 2-continued

Example 2

| Layer number | Material | Physical film thickness (nm) |
|---|---|---|
| L1 | 26 | $SiO_2$ | 10.00 |
| L2 | 27 | $SiO_2$ | 144.80 |
| L1 | 28 | $SiO_2$ | 10.00 |
| H | 29 | $TiO_2$ | 103.57 |
| L1 | 30 | $SiO_2$ | 10.00 |
| L2 | 31 | $SiO_2$ | 164.68 |
| L1 | 32 | $SiO_2$ | 10.00 |
| H | 33 | $TiO_2$ | 109.59 |
| L1 | 34 | $SiO_2$ | 10.00 |
| L2 | 35 | $SiO_2$ | 145.58 |
| L1 | 36 | $SiO_2$ | 10.00 |
| H | 37 | $TiO_2$ | 91.56 |
| L1 | 38 | $SiO_2$ | 10.00 |
| L2 | 39 | $SiO_2$ | 130.59 |
| L1 | 40 | $SiO_2$ | 10.00 |
| H | 41 | $TiO_2$ | 85.04 |
| L1 | 42 | $SiO_2$ | 10.00 |
| L2 | 43 | $SiO_2$ | 125.04 |
| L1 | 44 | $SiO_2$ | 10.00 |
| H | 45 | $TiO_2$ | 84.46 |
| L1 | 46 | $SiO_2$ | 10.00 |
| L2 | 47 | $SiO_2$ | 123.78 |
| L1 | 48 | $SiO_2$ | 10.00 |
| H | 49 | $TiO_2$ | 82.69 |
| L1 | 50 | $SiO_2$ | 10.00 |
| L2 | 51 | $SiO_2$ | 122.73 |
| L1 | 52 | $SiO_2$ | 10.00 |
| H | 53 | $TiO_2$ | 83.39 |
| L1 | 54 | $SiO_2$ | 10.00 |
| L2 | 55 | $SiO_2$ | 122.02 |
| L1 | 56 | $SiO_2$ | 10.00 |
| H | 57 | $TiO_2$ | 83.55 |
| L1 | 58 | $SiO_2$ | 10.00 |
| L2 | 59 | $SiO_2$ | 122.99 |
| L1 | 60 | $SiO_2$ | 10.00 |
| H | 61 | $TiO_2$ | 84.71 |
| L1 | 62 | $SiO_2$ | 10.00 |
| L2 | 63 | $SiO_2$ | 122.31 |
| L1 | 64 | $SiO_2$ | 10.00 |
| H | 65 | $TiO_2$ | 84.82 |
| L1 | 66 | $SiO_2$ | 10.00 |
| L2 | 67 | $SiO_2$ | 125.76 |
| L1 | 68 | $SiO_2$ | 10.00 |
| H | 69 | $TiO_2$ | 87.09 |
| L1 | 70 | $SiO_2$ | 10.00 |
| L2 | 71 | $SiO_2$ | 130.80 |
| L1 | 72 | $SiO_2$ | 10.00 |
| H | 73 | $TiO_2$ | 86.62 |
| L1 | 74 | $SiO_2$ | 10.00 |
| L2 | 75 | $SiO_2$ | 66.06 |

As listed in Table 2, in Example 2, a film X1 (adhesion strength enhancing layer) made of the mixture α was formed on the front surface of the transparent substrate by the heating deposition method in order to improve the adhesion to the transparent substrate. Then, a $TiO_2$ film Y1, a $SiO_2$ film Y2, and a $SiO_2$ film Y3 were formed in sequence by the heating deposition method on the front surface of the transparent substrate via the film X1 made of the mixture α in order to suppress the ripple. Thereafter, using the combination of the high-refractive index film H, the first low-refractive index film L1, the second low-refractive index film L2, and the first low-refractive index film L1 as a base unit, and film formation was repeatedly performed by the base unit, whereby the optical multilayer film was formed on the front surface of the transparent substrate. In other words, in Example 2, the first low-refractive index films L1 are formed both at an upper side portion close to the interface located on the upper side and at a lower side portion close to the interface located on the lower side respectively in the low-refractive index film L.

FIG. 7 is a chart illustrating results of the spectral characteristics of the IRCF according to Example 2. In FIG. 7, the vertical axis represents the transmittance and the horizontal axis represents the wavelength. Note that, in FIG. 7, a chain line indicates the spectral characteristics before the PCT and a solid line indicates the spectral characteristics after the PCT. As illustrated in FIG. 7, in Example 2, the spectral characteristics have little or no change between before and after execution of the PCT. Further, the change in spectral characteristics is smaller in Example 2 than in Example 1 (see FIG. 6). Further, in Example 2, no film crack occurred and occurrence of haze was not confirmed.

Note that the transmittance cyclically decreases on the long wavelength side in Example 2. However, this phenomenon is not caused from the haze of Example 2.

The optical multilayer film may change in refractive index due to water infiltration after the heating deposition. Further, the outermost layer (air side) itself which is most likely to be affected by the PCT (pressure cooker test) in the low-refractive index film L sometimes changes in quality. These cause a ripple in some cases. The phenomenon that the transmittance cyclically decreases on the log wavelength side as described above is considered to be caused from the occurrence of the ripple. In other words, the above phenomenon is not caused from the haze occurring by the influence of the PCT (pressure cooker test) in the vicinity of the interface between the high-refractive index film H and the low-refractive index film L. If the haze occurs, the PCT (pressure cooker test) exerts a greater influence on a shorter wavelength. However, the influence has comparatively low dependence on the wavelength, and the whole transmission band uniformly decreases in transmittance. Therefore, the above phenomenon is considered to arise from a cause completely different from the haze.

Comparative Example 1

In Comparative Example 1, the IRCF was formed by providing the optical multilayer film in which the high-refractive index film H and the low-refractive index film L were alternately stacked on the front surface (principal surface S1) of the transparent substrate and providing an anti-reflection film (AR) composed of six layers on the rear surface (principal surface S2) of the transparent substrate. Then, the spectral characteristics after the PCT (pressure cooker test) were measured for the IRCF.

Film formation conditions of Comparative Example 1 will be indicated below.

(Degree of Vacuum in Film Formation)

High-refractive index film H ($TiO_2$): $1.3 \times 10^{-2}$ Pa

Low-refractive index film L ($SiO_2$): $4.0 \times 10^{-3}$ Pa (Transparent Substrate Temperature in Film Formation)

The temperature of the transparent substrate was set to 190° C.

(Film-forming Rate)

High-refractive index film H ($TiO_2$): 4 Å/S (angstrom/sec)

Low-refractive index film L ($SiO_2$): 6 Å/S (angstrom/sec)

Table 3 lists film conditions (film configuration, film material, physical film thickness) of the optical multilayer film formed on the front surface (principal surface S1) of the transparent substrate in Comparative Example 1.

TABLE 3

Comparative Example 1

| Layer number | Material | Physical film thickness (nm) |
|---|---|---|
| X1 | 1 | Mixture α | 10.00 |
| Y1 | 2 | $TiO_2$ | 12.87 |
| Y2 | 3 | $SiO_2$ | 38.04 |
| H | 4 | $TiO_2$ | 122.23 |
| L | 5 | $SiO_2$ | 190.28 |
| H | 6 | $TiO_2$ | 118.36 |
| L | 7 | $SiO_2$ | 196.25 |
| H | 8 | $TiO_2$ | 119.35 |
| L | 9 | $SiO_2$ | 196.68 |
| H | 10 | $TiO_2$ | 119.88 |
| L | 11 | $SiO_2$ | 194.83 |
| H | 12 | $TiO_2$ | 118.75 |
| L | 13 | $SiO_2$ | 189.29 |
| H | 14 | $TiO_2$ | 105.71 |
| L | 15 | $SiO_2$ | 164.80 |
| H | 16 | $TiO_2$ | 103.57 |
| L | 17 | $SiO_2$ | 184.68 |
| H | 18 | $TiO_2$ | 109.59 |
| L | 19 | $SiO_2$ | 165.58 |
| H | 20 | $TiO_2$ | 91.56 |
| L | 21 | $SiO_2$ | 150.59 |
| H | 22 | $TiO_2$ | 85.04 |
| L | 23 | $SiO_2$ | 145.04 |
| H | 24 | $TiO_2$ | 84.46 |
| L | 25 | $SiO_2$ | 143.78 |
| H | 26 | $TiO_2$ | 82.69 |
| L | 27 | $SiO_2$ | 142.73 |
| H | 28 | $TiO_2$ | 83.39 |
| L | 29 | $SiO_2$ | 142.02 |
| H | 30 | $TiO_2$ | 83.55 |
| L | 31 | $SiO_2$ | 142.99 |
| H | 32 | $TiO_2$ | 84.71 |
| L | 33 | $SiO_2$ | 142.31 |
| H | 34 | $TiO_2$ | 84.82 |
| L | 35 | $SiO_2$ | 145.76 |
| H | 36 | $TiO_2$ | 87.09 |
| L | 37 | $SiO_2$ | 150.80 |
| H | 38 | $TiO_2$ | 86.62 |
| L | 39 | $SiO_2$ | 76.06 |

As listed in Table 3, in Comparative Example 1, a film X1(adhesion strength enhancing layer) made of the mixture α was formed on the front surface of the transparent substrate by the heating deposition method in order to improve the adhesion to the transparent substrate. Then, a $TiO_2$ film Y1 and a $SiO_2$ film Y2 were formed in sequence by the heating deposition method on the front surface of the transparent substrate via the film X1 made of the mixture α in order to suppress the ripple. Thereafter, using the combination of the high-refractive index film H and the low-refractive index film L as a base unit, and film formation was repeatedly performed by the base unit, whereby the optical multilayer film was formed on the front surface of the transparent substrate. In other words, in Comparative Example 1, a portion low in density is not formed at a portion of the low-refractive index film L close to the interface between the low-refractive index film L and the high-refractive index film H so that the whole low-refractive index film L is formed to have the same density.

Figure 8:
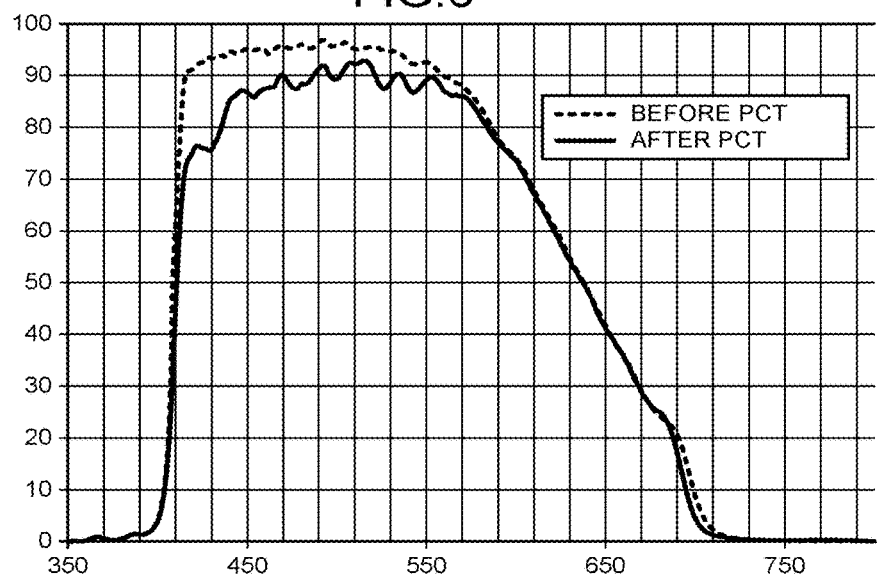
FIG. 8 is a chart illustrating spectral characteristics of a near-infrared cut filter according to Comparative Example 1.

FIG. 8 is a chart illustrating results of the spectral characteristics of the IRCF according to Comparative Example 1. In FIG. 8, the vertical axis represents the transmittance and the horizontal axis represents the wavelength. Note that, in FIG. 8, a chain line indicates the spectral characteristics before the PCT and a solid line indicates the spectral characteristics after the PCT. As illustrated in FIG. 8, in Comparative Example 1, the spectral characteristics considerably change between before and after execution of the PCT. Further, in Comparative Example 1, the transmittance after the PCT decreases from the transmittance before the PCT, and therefore haze occurs after the PCT. Note that, in Comparative Example 1, it was not confirmed that film cracks occurred due to high temperature heating.

Comparative Example 2

In Comparative Example 2, the IRCF was formed by providing the optical multilayer film in which the high-refractive index film H and the low-refractive index film L were alternately stacked on the front surface (principal surface S1) of the transparent substrate and providing an anti-reflection film (AR) composed of six layers on the rear surface (principal surface S2) of the transparent substrate. Then, the spectral characteristics after the PCT (pressure cooker test) were measured for the IRCF.

Film formation conditions of Comparative Example 2 will be indicated below.

(Degree of Vacuum in Film Formation)
High-refractive index film H ($TiO_2$): $1.3 \times 10^{-2}$ Pa
Low-refractive index film L ($SiO_2$): $6.5 \times 10^{-3}$ Pa
(Transparent Substrate Temperature in Film Formation)
The temperature of the transparent substrate was set to 190° C.
(Film-forming Rate)
High-refractive index film H ($TiO_2$): 4 Å/S (angstrom/sec)
Low-refractive index film L ($SiO_2$): 6 Å/S (angstrom/sec)

Note that the film conditions of Comparative Example 2 are the same as the film conditions of Comparative Example 1 except the degree of vacuum in film formation of the low-refractive index film L.

In Comparative Example 2, the optical multilayer film is constituted by using the combination of the high-refractive index film H and the low-refractive index film L as a base unit, and repeating the base unit, as in Comparative Example 1. In other words, in Comparative Example 2, a portion low in density is not formed at a portion of the low-refractive index film L close to the interface between the low-refractive index film L and the high-refractive index film H. The low-refractive index film L is composed of only a film low in density like the first low-refractive index film L1 illustrated in Example 1.

Figure 9:
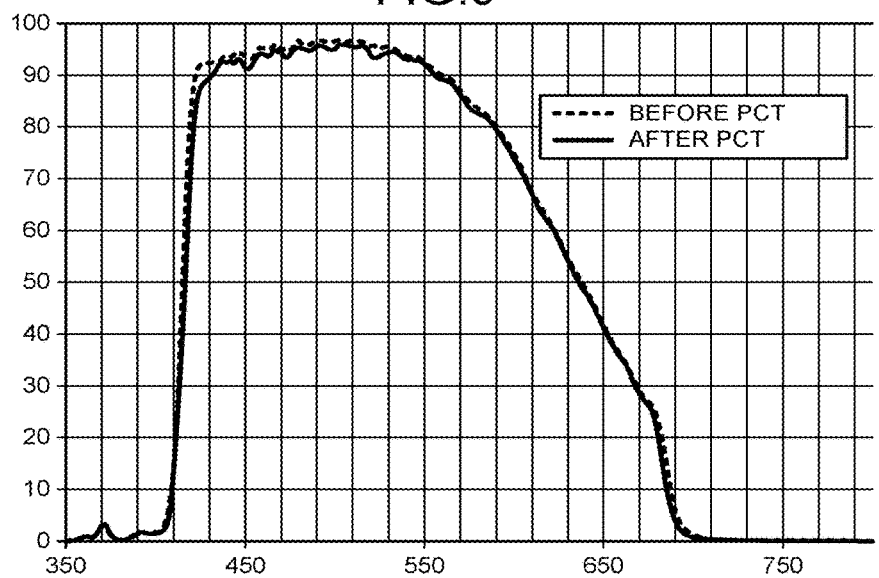
FIG. 9 is a chart illustrating spectral characteristics of a near-infrared cut filter according to Comparative Example 2.

FIG. 9 is a chart illustrating the spectral characteristics of the IRCF according to Comparative Example 2. In FIG. 9, the vertical axis represents the transmittance and the horizontal axis represents the wavelength. Note that, in FIG. 9, a chain line indicates the spectral characteristics before the PCT and a solid line indicates the spectral characteristics after the PCT. As illustrated in FIG. 9, in Comparative Example 2, the spectral characteristics have little or no change between before and after execution of the PCT. Further, in Comparative Example 2, occurrence of haze was not confirmed. However, in Comparative Example 2, film cracks occurred in the optical multilayer film in high temperature heating.

(Evaluation of Erosion by Etching)

Etching was performed using fluorine on the cross sections of optical multilayer films having the same configurations as those of Example 2 and Comparative Example 1. Then, it was confirmed whether the low-refractive index film L ($SiO_2$) was eroded at the cross section by the etching. Concretely, the above-described optical multilayer film was subjected to ultrasonic cleaning with pure water for 30 seconds, and then immersed in an HF (hydrogen fluoride)

solution having a concentration of 0.25% for 15 seconds and thereby be subjected to the above-described etching.

Figure 10:
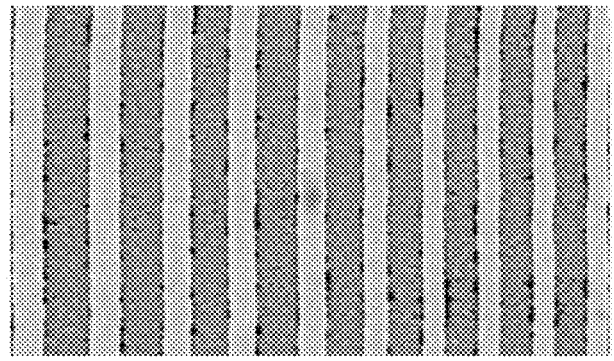
FIG. 10 is a SEM image of the near-infrared cut filter according to Example 2.

FIG. 10 indicates a SEM image imaged after the etching was performed on the optical multilayer film having the same configuration as that in the case of Example 2. As illustrated in FIG. 10, in the optical multilayer film having the same configuration as that in the case of Example 2, a portion of the low-refractive index film L close to the interface with the high-refractive index film H is intensively eroded. As is found from this, in Example 2, the low-refractive index film L is lower in density at a portion close to the interface with the high-refractive index film H than at a central region.

Note that, in Example 1, the first low-refractive index film L1, the second low-refractive index film L2, and the high-refractive index film H are formed under the same film formation conditions as those in Example 2. Therefore, the low-refractive index film L is considered to be lower in density at a portion close to the interface with the high-refractive index film H than at a central region in Example 1 as in Example 2.

Figure 11:
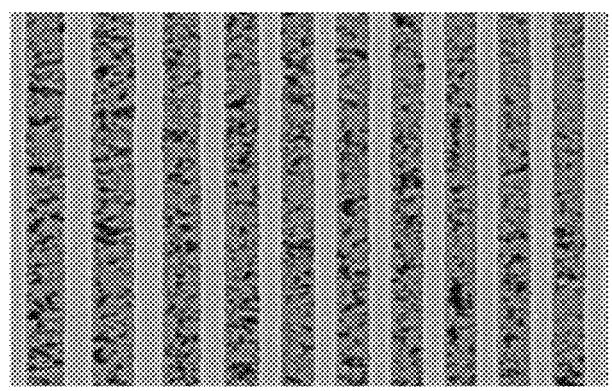
FIG. 11 is a SEM image of the near-infrared cut filter according to Comparative Example 1.

FIG. 11 indicates a SEM image imaged after the etching was performed on the optical multilayer film having the same configuration as that in the case of Comparative Example 1. As illustrated in FIG. 11, in the optical multilayer film having the same configuration as that in the case of Comparative Example 1, the whole low-refractive index film L was substantially uniformly etched. As is found from this, the density is the same and there is little or no difference between a central region of the low-refractive index film L and a portion close to the interface between the low-refractive index film L and the high-refractive index film H.

Note that, in Comparative Example 2, the low-refractive index film L is formed under the same film formation conditions as those of Comparative Example 1. Therefore, it is considered that the density is the same and there is little or no difference between a central region of the low-refractive index film L and a portion close to the interface between the low-refractive index film L and the high-refractive index film H in Comparative Example 2 as in Comparative Example 1.

Making the density of the portion of the low-refractive index film close to the interface with the high-refractive index film lower than that of other portions makes it possible to suppress deterioration of the spectral characteristics of the optical multilayer film due to the execution of the PCT. In addition, it is possible to reduce the occurrence of haze and occurrence of film cracks. Consequently, an optical filter excellent in weather resistance and a method for manufacturing the optical filter can be provided.

As described above, the optical filter and the method for manufacturing the optical filter can decrease the deterioration of the spectral characteristics of the optical multilayer film due to the execution of the PCT and reduce the occurrence of haze and film cracks. Therefore, the above optical filter can be suitably used for the use application required to have weather resistance. For example, the above-described optical filter can be suitably used in the use application of correcting the spectrum in a solid-state imaging device (for example, a CCD image sensor, a CMOS image sensor or the like) of a digital camera, a digital video or the like.

What is claimed is:
1. An optical filter, comprising:
   a transparent substrate; and
   an optical multilayer film formed on a surface of the transparent substrate and comprising a low-refractive index film and a high-refractive index film such that the low-refractive index film and the high-refractive index film are alternately stacked,
   wherein the high-refractive index film is higher in refractive index than the low-refractive index film, and the low-refractive index film includes silicon oxide and has a low density portion formed closer to an interface between the low-refractive index film and the high-refractive index film than a middle portion of the low-refractive index film such that a density of the low density portion is lower than a density of the middle portion of the low-refractive index film.

2. The optical filter according to claim 1, wherein the low-refractive index film comprises a first low-refractive index film stacked on the high-refractive index film and forming the low density portion and a second low-refractive index film stacked on the first low-refractive index film and forming the middle portion higher in density than the first low-refractive index film.

3. The optical filter according to claim 2, wherein the first low-refractive index film has a physical film thickness of 3 nm or more and equal to or lower than half a physical film thickness of the low-refractive index film.

4. The optical filter according to claim 2, wherein transparent substrate is fluorophosphoric acid glass.

5. The optical filter according to claim 1, wherein the low-refractive index film becomes higher in density with increasing distance from the interface with the high-refractive index film in a direction vertical to the surface of the transparent substrate.

6. The optical filter according to claim 5, wherein the transparent substrate is fluorophosphoric acid glass.

7. The optical filter according to claim 1, wherein the high-refractive index film includes an oxide material selected from the group consisting of titanium, niobium, and tantalum.

8. The optical filter according to claim 7, wherein the low-refractive index film comprises a first low-refractive index film stacked on the high-refractive index film and forming the low density portion and a second low-refractive index film stacked on the first low-refractive index film and forming the middle portion higher in density than the first low-refractive index film.

9. The optical filter according to claim 8, wherein the first low-refractive index film has a physical film thickness of 3 nm or more and equal to or lower than half a physical film thickness of the low-refractive index film.

10. The optical filter according to claim 7, wherein the low-refractive index film becomes higher in density with increasing distance from the interface with the high-refractive index film in a direction vertical to the surface of the transparent substrate.

11. The optical filter according to claim 7, wherein the transparent substrate is fluorophosphoric acid glass.

12. The optical filter according to claim 1, wherein the optical multilayer film is formed by vacuum deposition.

13. A near-infrared cut filter, comprising the optical filter of claim 1.

14. The optical filter according to claim 1, wherein the transparent substrate is fluorophosphoric acid glass.

15. A method for manufacturing an optical filter, comprising:
   forming an optical multilayer film on a surface of a transparent substrate by alternately stacking a low-refractive index film and a high-refractive index film,
   wherein the high-refractive index film is higher in refractive index than the low-refractive index film, and the forming comprises forming the low-refractive index film such that the low-refractive index film includes silicon oxide and has a low density portion formed closer to an interface between the low-refractive index film and the high-refractive index film than a middle portion of the low-refractive index film and that a density of the low density portion is lower than a density of the middle portion of the low-refractive index film.

16. The method for manufacturing an optical filter according to claim 15, wherein the forming comprises stacking a first low-refractive index film forming the low density portion on the high-refractive index film and stacking a second low-refractive index film forming the middle portion higher in density than the first low-refractive index film, on the first low-refractive index film.

17. The method for manufacturing an optical filter according to claim 15, wherein the forming comprises forming the low-refractive index film such that the low-refractive index film becomes higher in density with increasing distance from the interface with the high-refractive index film in a direction vertical to the surface of the transparent substrate.

18. The method for manufacturing an optical filter according to claim 15, wherein the forming comprises controlling a degree of vacuum in a film forming chamber such that the density of the low-refractive index film is controlled.

19. The method for manufacturing an optical filter according to claim 18, wherein the forming comprises controlling a flow rate of an oxygen gas to be introduced into the film forming chamber such that the density of the low-refractive index film is controlled.

20. The method for manufacturing an optical filter according to claim 15, wherein the forming comprises forming the optical multilayer film by vacuum deposition.

* * * * *